(12) United States Patent
Lu et al.

(10) Patent No.: US 8,815,649 B2
(45) Date of Patent: Aug. 26, 2014

(54) MULTI-LAYER LEAD FRAME PACKAGE AND METHOD OF FABRICATION

(71) Applicant: Alpha & Omega Semiconductor Incorporated, Sunnyvale, CA (US)

(72) Inventors: Jun Lu, San Jose, CA (US); Ming Sun, Sunnyvale, CA (US); Yueh-Se Ho, Sunnyvale, CA (US); Kai Liu, Mountain View, CA (US); Lei Shi, Shanghai (CN)

(73) Assignee: Alpha & Omega Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/941,629

(22) Filed: Jul. 15, 2013

(65) Prior Publication Data
US 2013/0302946 A1    Nov. 14, 2013

Related U.S. Application Data

(62) Division of application No. 12/726,892, filed on Mar. 18, 2010, now Pat. No. 8,513,784.

(51) Int. Cl.
*H01L 21/44* (2006.01)
*H01L 21/48* (2006.01)

(52) U.S. Cl.
USPC ............ 438/123; 438/107; 438/109; 438/11; 438/112; 257/E21.506

(58) Field of Classification Search
CPC ......... H01L 21/56; H01L 24/37; H01L 24/40; H01L 24/84; H01L 24/97; H01L 23/49524
USPC ................... 438/107, 109, 111, 112, 123; 257/E21.506

See application file for complete search history.

(56) References Cited

U.S. PATENT DOCUMENTS

| | | | | |
|---|---|---|---|---|
| 5,331,235 A * | 7/1994 | Chun | ............................ | 257/777 |
| 5,471,369 A * | 11/1995 | Honda et al. | .................. | 361/813 |
| 5,677,567 A * | 10/1997 | Ma et al. | ....................... | 257/666 |
| 6,252,299 B1 * | 6/2001 | Masuda et al. | ................ | 257/686 |
| 6,399,420 B2 * | 6/2002 | Cha et al. | ...................... | 438/109 |
| 6,479,322 B2 * | 11/2002 | Kawata et al. | ................ | 438/109 |
| 2010/0019362 A1 * | 1/2010 | Galera et al. | .................. | 257/676 |

* cited by examiner

*Primary Examiner* — Nitin Parekh
(74) *Attorney, Agent, or Firm* — Kenneth C. Brooks

(57) ABSTRACT

The present invention features a method for fabricating a lead-frame package, having a first, second, third and fourth electrically conductive structures with a pair of semiconductor dies disposed therebetween defining a stacked structure. The first and second structures are spaced-apart from and in superimposition with the first structure. A semiconductor die is disposed between the first and second structures. The semiconductor die has contacts electrically connected to the first and second structures. A part of the third structure lies in a common plane with a portion of the second structure. The third structure is coupled to the semiconductor die.

20 Claims, 15 Drawing Sheets

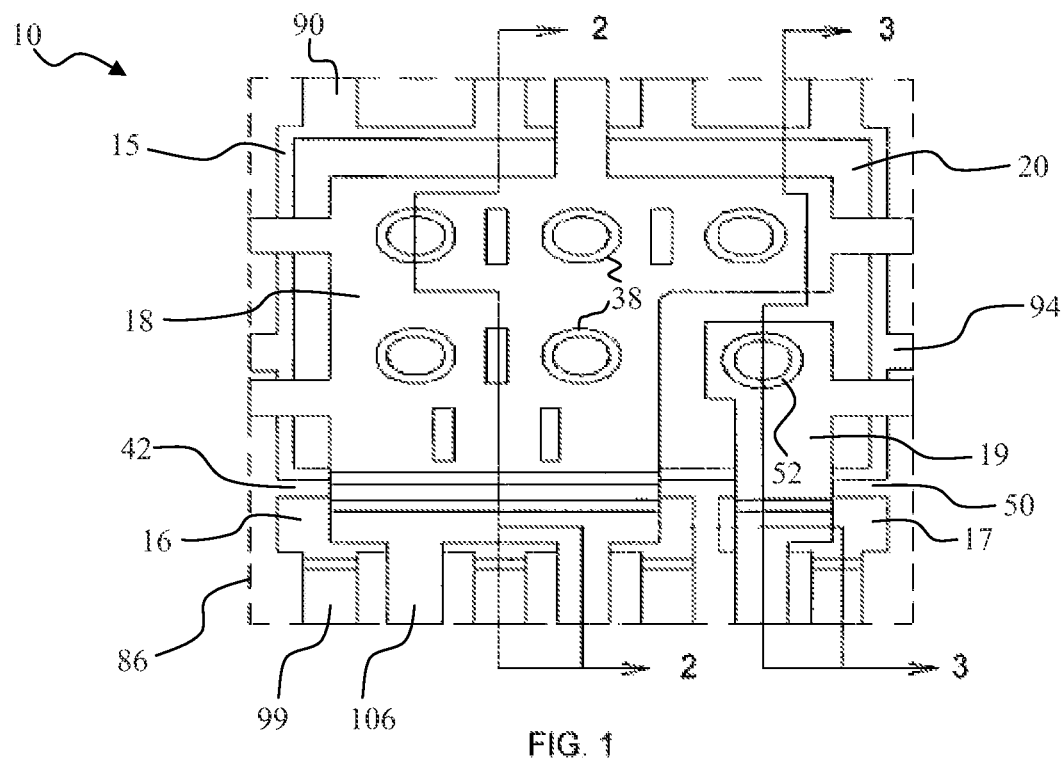
FIG. 1
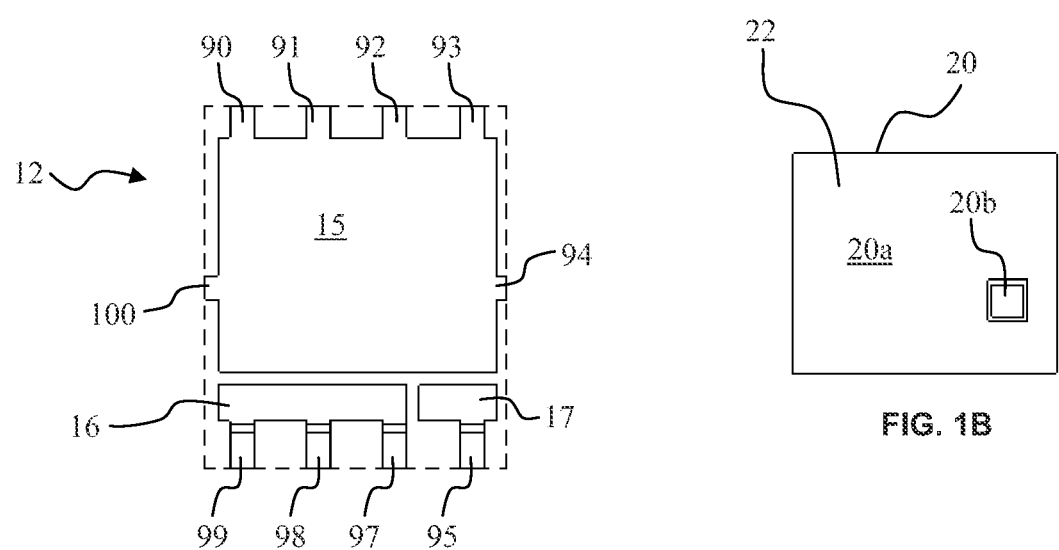
FIG. 1A
FIG. 1B

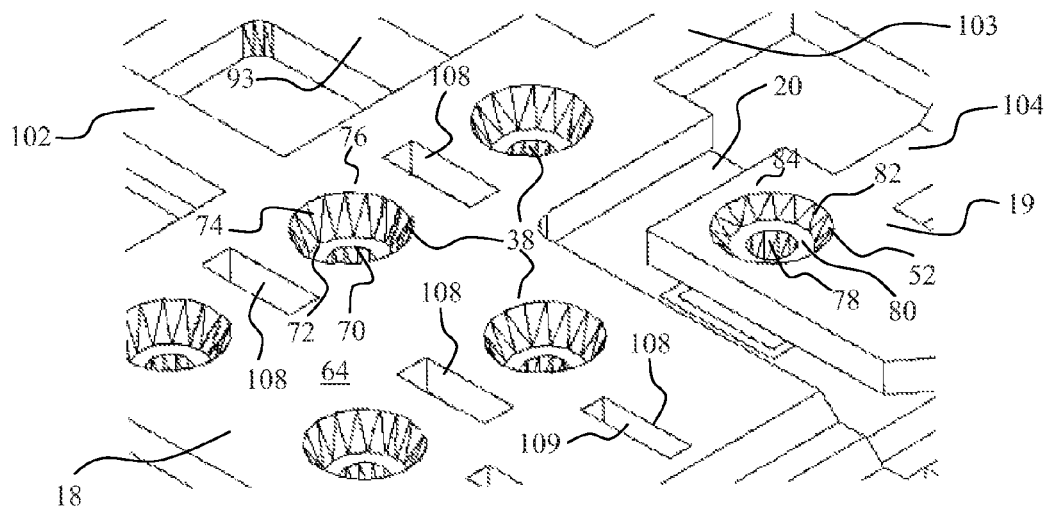

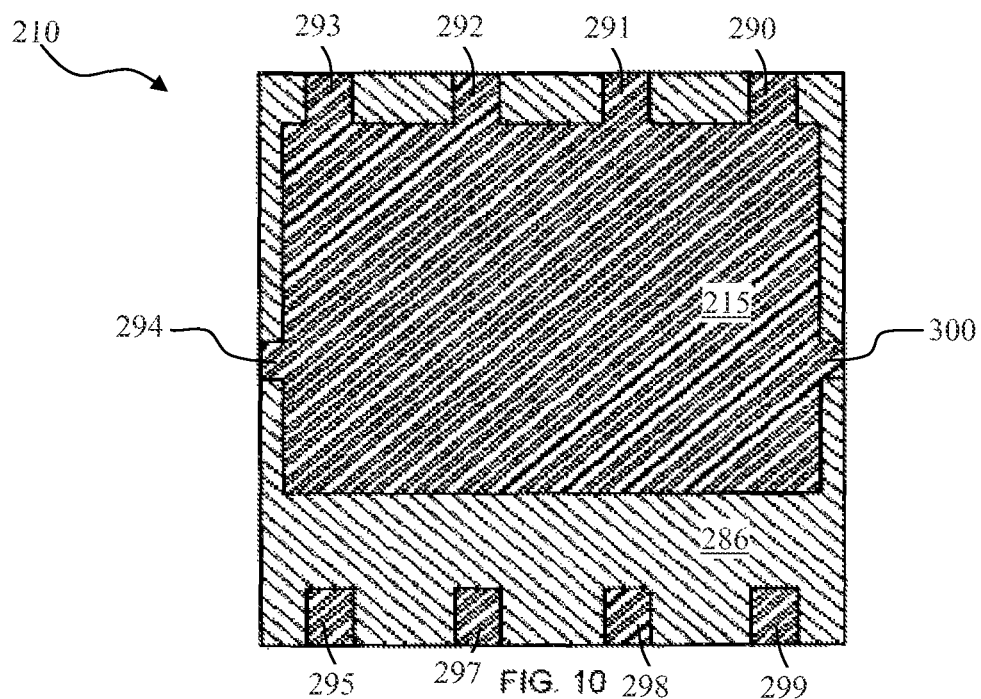
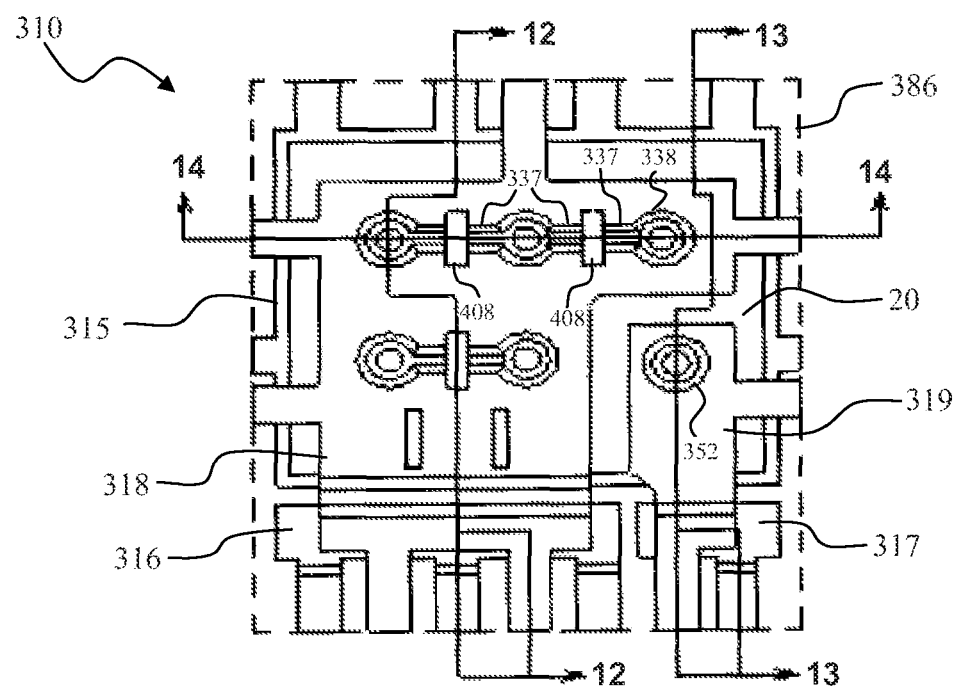
FIG. 11

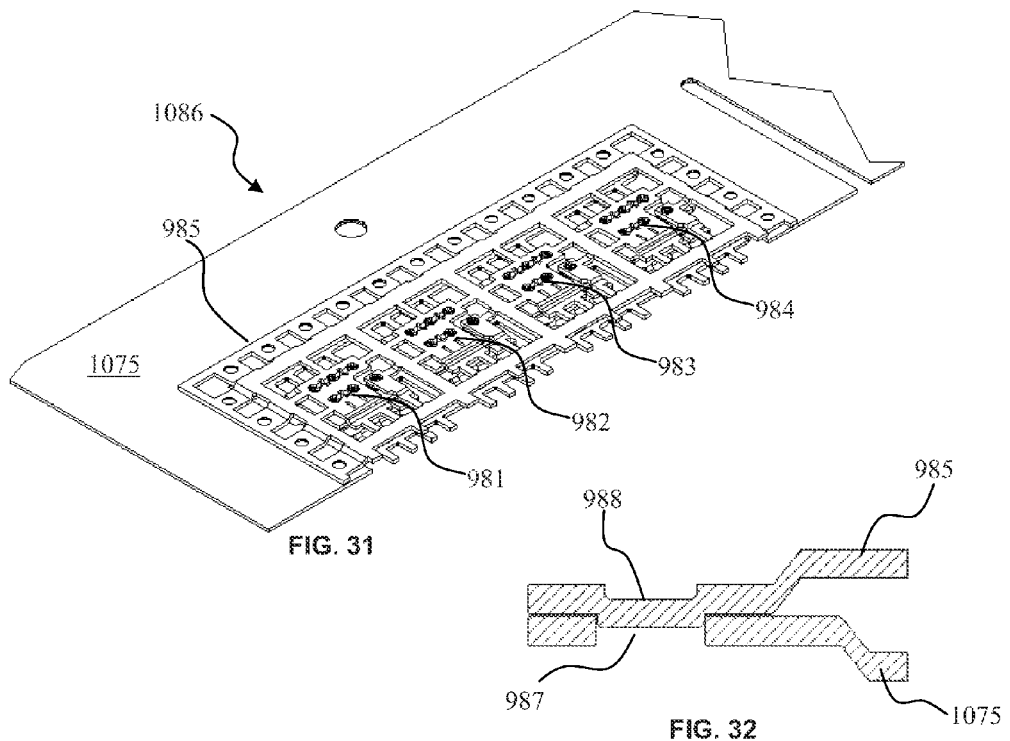
FIG. 31
FIG. 32
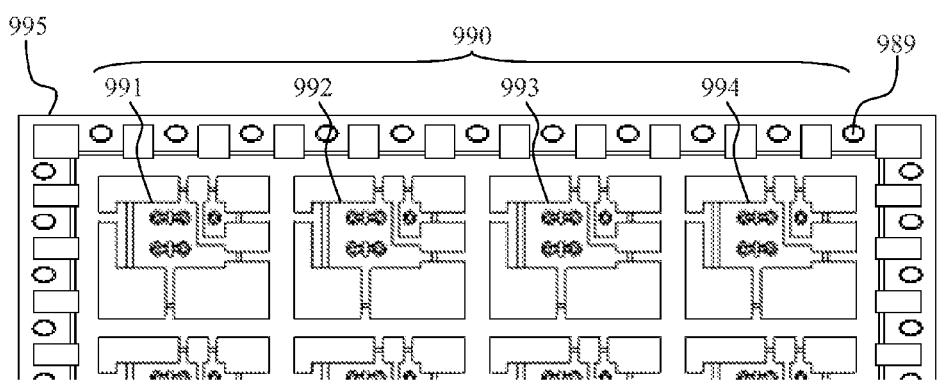
FIG. 33
FIG. 34

MULTI-LAYER LEAD FRAME PACKAGE AND METHOD OF FABRICATION

CROSS-REFERENCE TO RELATED PATENT APPLICATIONS

The present application is a divisional patent application of U.S. patent application Ser. No. 12/726,892 filed on Mar. 18, 2010 for MULTI-LAYER LEAD FRAME PACKAGE AND METHOD OF FABRICATION naming Jun Lu, Ming Sun, Yueh-So Ho, Kai Liu, and Lei She as inventors, which is incorporated by reference herein in its entirety.

BACKGROUND OF THE INVENTION

The present invention generally relates to semiconductor packages and more particularly to multi-layer lead frame package and method of fabrication.

Current lead frame assembly technology employs a piece of metal alloy with a plurality of unit cells, each of which receives one or a given number of dice by die attaching process;

Most commonly, metal wires, typically fabricated from gold (Au) aluminum (Al) or copper (Cu), are then bonded onto both the top pads of one or more semiconductor dies and the lead pads of the lead frame in order to deliver signal and/or power from outside of lead frame package to internal dies and vice versa.

Metal plates and/or clips connecting the dies and the lead frame have been introduced in recent years for power semiconductor packages to eliminate wire bonding process and to reduce on resistance. However, current clip/plate assembly process employs a clip attaching step which picks and drops clip(s) for each die in a one-after-another sequence. This will reduce throughput. A need exists, therefore, to provide power semiconductor packages having desired operational characteristics.

SUMMARY OF THE INVENTION

The present invention features a method of forming a leadframe package, featuring a first structure, the first structure being electrically conductive; a second structure spaced apart from and in superimposition with the first structure, the second structure being electrically conductive; a semiconductor die disposed between the first and second structure, with a segment of the second structure being spaced apart from the semiconductor die defining a volume and having a throughway extending between opposing sides of the second structure, the throughway being in fluid communication with the volume, the semiconductor die having contacts electrically connected to the first and second structures; and molding compound disposed to encapsulate a portion of the package with a sub-portion of the molding compound being disposed in the volume. In another embodiment, third structure is included, a part of which lies in a common plane with a portion of the second structure. The third structure is electrically conductive and is in electrical communication with the semiconductor die. In yet another embodiment, an additional semiconductor die is in superimposition with and attached to one of the first and second structures. A fourth structure is in superimposition with the additional semiconductor die and is electrically conductive and in electrical communication with the additional semiconductor die. These and other aspects of the invention are discussed more fully below.

BRIEF DESCRIPTION OF THE DRAWINGS

FIG. 1 is a top view of a semiconductor die package in accordance with a first embodiment of the present invention;

FIG. 1A is a top view of a first lead frame of the semiconductor die package of FIG. 1;

FIG. 1B is a top view of the semiconductor die of the semiconductor die package of FIG. 1;

FIG. 4 is a detailed view of the contact dimples and throughways shown in FIGS. 1-3;

FIG. 5A is a side view of the package shown in FIG. 1;

FIG. 5B is a side view rotated 90 degrees of the package shown in FIG. 5A;

FIGS. 6A and 6B are a bottom view and a top view, respectively of the package shown in FIG. 5;

FIG. 10 is a bottom view of the package like that shown in FIG. 1 with molding material;

FIG. 11 is a top view of a semiconductor die package in accordance with a third embodiment of the present invention;

FIG. 31 is a perspective view showing an assembled batch of packages of FIG. 30;

FIG. 32 is a side cross sectional view of alignment orifices and alignment protrusions of FIG. 31.

FIG. 33 is a top view of second semiconductor dies for a lead frame structure like that shown in FIG. 31.

FIG. 34 is a top view of a top lead frame for a lead frame structure like that shown in FIG. 31.

DETAILED DESCRIPTION OF THE INVENTION

Figure 1C:
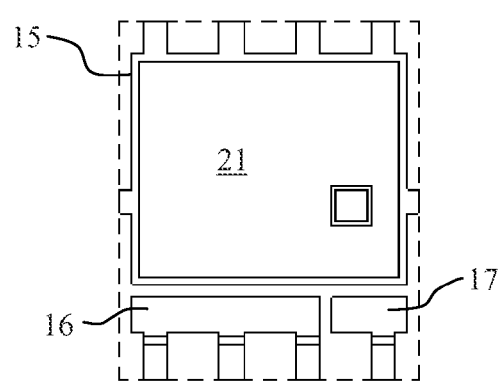
FIG. 1C is a top view of the semiconductor die mounted atop the first lead frame of the semiconductor die package of FIG. 1.

Referring to FIGS. 1 through 6B, a multi-layer lead frame package 10 includes first and second electrically conductive lead frames 12 and 14. First lead frame 12 includes three spaced structures 15, 16 and 17. Second lead frame 14 includes two spaced structures 18 and 19. Structure 18 is in superimposition with portions of both structures 15 and 16, and structure 19 is in superimposition with portions of both structures 15 and 17. A semiconductor die 20 is included in package 10. Semiconductor die 20 may be any known in the electrical art. In the present example semiconductor die 20 may be a transistor such as a power Field Effect Transistor (FET) or a power metal oxide semiconductor FET (MOSFET) having a source electrode 20a and a gate electrode 20b on its top side and a drain electrode (not shown) on its bottom side, with structure 15 forming a drain contact, structure 18 forming a source contact and structure 19 forming a gate contact. In an alternative embodiment, structure 19 may be replaced with a bond wire. Lead frames 12 and 14 may be formed from any conductive material suitable to conduct the current drawn by semiconductor die 20. Examples of materials from which lead frames 12 and 14 may be fabricated include aluminum, copper, gold and the like.

Figure 2:
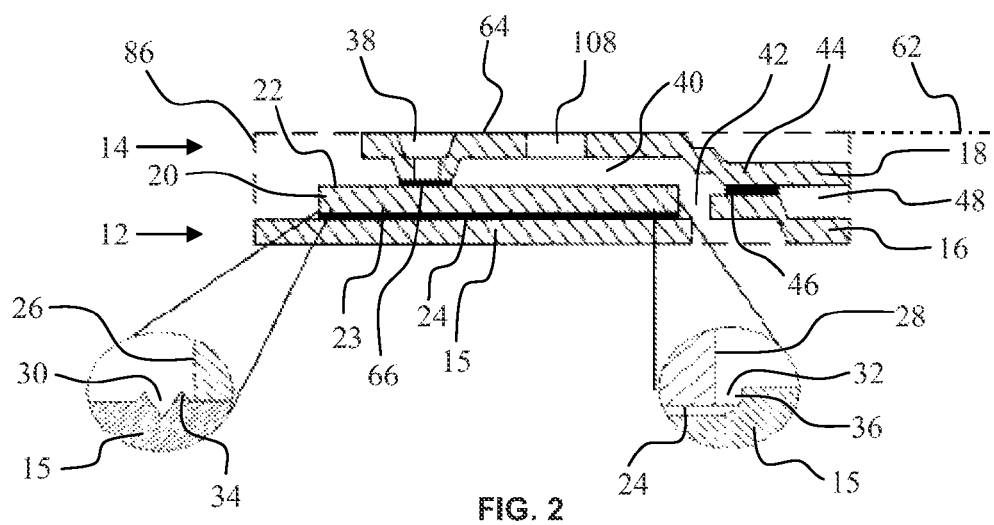
FIG. 2 is a cross-sectional view of the package shown in FIG. 1 taken along lines 2-2.
Figure 3:
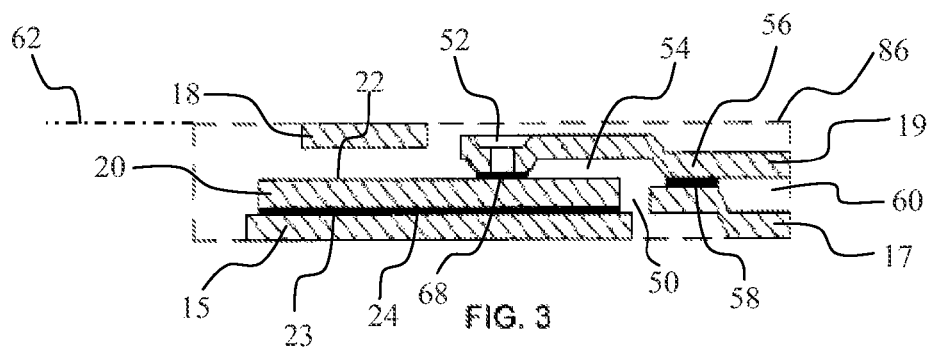
FIG. 3 is a cross-sectional view of the package shown in FIG. 1 taken along lines 3-3.

Referring to both FIGS. 2 and 3, structures 18 and 19 face a first side 22 (e.g., source and gate side) of semiconductor die 20, and structure 15 faces a second side 23 (e.g., drain side) of semiconductor die 20, disposed opposite to first side 22. Second side 23 is attached to structure 15 using a suitable adhesive/bonding agent 24, such as electrically conductive epoxy, solder and the like. To facilitate attachment of semiconductor die 20 to structure 15 one or more sides of semiconductor die 20, shown as 26 and 28, may be disposed proximate to a ridge or recess, shown as 30 and 32 on structure 15. It is desired that semiconductor die 20 be surrounded by one of ridge/recesses 30 and 32 to fix the semiconductor die 20 in place. As a result, the position of semiconductor die 20 may be precisely controlled during fabrication of package 10. Specifically, a wall 34 formed by recess 30 may function to both prevent semiconductor die 20 from moving beyond the same and serves to retain bonding agent 24 within a desired region of structure 15. Similarly, a wall 36 formed by recess 32 may function to both prevent semiconductor die 20 from moving beyond the same and serves to retain bonding agent 24 within a desired region of structure 15.

Referring again to both FIGS. 1 and 2, excepting contact dimples 38, structure 18 is spaced-apart from semiconductor die 20. In this manner a volume 40 is defined between structure 18 and semiconductor die 20. Structure 16 is in juxtaposition with, and spaced-apart from, semiconductor die 20 defining a hiatus 42 therebetween, which is in fluid communication with volume 40. A portion 44 of structure 18 is fixedly attached to structure 16 using a suitable electrically conductive adhesive/bonding agent 46, mentioned above. A segment of both structures 16 and 18 extend away from bonding agent 46 and are spaced-apart from one another defining a gap 48 therebetween.

Referring again to both FIGS. 2 and 3, structure 17 is in juxtaposition with, and spaced-apart from, semiconductor die 20, defining a hiatus 50. Structure 19 extends between semiconductor die 20 and structure 17 to be in superimposition with a portion of hiatus 50. Excepting contact dimple 52, structure 19 is spaced-apart from semiconductor die 20, defining a volume 54 therebetween. A portion 56 of structure 19 is fixedly attached to structure 17 using suitable electrically conductive adhesive/bonding agent 58, mentioned above. A segment of both structures 17 and 19 extend away from bonding agent 58 spaced-apart from one another, defining a gap 60 therebetween.

Referring to FIGS. 2, 3 and 4, electrical communication between structure 18 and semiconductor die 20 is achieved by employing contact dimples 38. Each contact dimple 38 is integrally formed with structure 18 and extends away from a plane 62 in which a crown surface 64 of lead frame 14 lies toward semiconductor die 20, terminating at a region 66 thereof. A conductive bonding agent, such as those mentioned above, fixedly attaches contact dimple 38 to region 66. Region 66 typically includes a contact (e.g. source electrode 20a of FIG. 1B) in electrical communication with the circuitry (not shown) included in semiconductor die 20. In a similar fashion, structure 19 is in electrical communication with a region 68 of semiconductor die 20 employing contact dimple 52. Contact dimple 52 is integrally formed with structure 19. A suitable adhesive/bonding agent fixedly attaches contact dimple 52 to region 68, such as an electrically conductive adhesive/bonding agent mentioned above. Region 68 typically includes a contact (e.g., gate electrode 20b of FIG. 1B) in electrical communication with the circuitry (not shown) included in semiconductor die 20.

Each of contact dimples 38 includes a via 70, an annular shoulder 72, an annular wall 74 and an orifice 76. Via 70 extends from region 66 and terminates in annular shoulder 72. Annular wall 74 extends from annular shoulder 72 and terminates in orifice 76. Similarly, contact dimple 52 includes a via 78, an annular shoulder 80, an annular wall 82 and an orifice 84. Via 78 extends from region 68 and terminates in annular shoulder 80. Annular wall 82 extends from annular shoulder 80 and terminates in orifice 84. The structures 18 and 19 may also be referred to as aperture structures.

Package 10 is encapsulated in a molding compound 86, the outline of which shown by dotted lines in some of the figures (i.e., FIGS. 1, 1A, 1C, 2 and 3). Molding compound 86 may be any electrically insulative material known in the art. The characteristics of molding compound 86 are suitable for the application of package 10. In the present example molding compound 86 is a material that, when applied, has suitable viscosity to allow conforming to the shape of lead frames 12 and 14 and semiconductor die 20 and filling of voids/volumes 40, 54 hiatuses 42 and 50, gaps 48 and 60, and so on, encapsulating semiconductor die 20, and lead frames 12 and 14, excepting an end of tie bars 90-107. To facilitate filling of void 40, a plurality of throughways 108 are formed into structure 18 in fluid communication with void 40. Each throughway 108 extends from an opening 109 disposed on crown surface 64 and terminate in an opening 110 on a surface of structure 18 disposed opposite to crown surface 64. The throughways 108 also help the molding compound 86 to lock on to the structure 18. Typically, molding compound 86 provides package 10 with a shape of a rectangular prism, shown more clearly in the side views of FIGS. 5A and 5B.

FIG. 5A shows the ends of the tie bars 105 and 106 of structure 18, tie bar 96 of structure 19, tie bars 97 to 99 of structure 16 and tie bar 95 of structure 17 exposed through the molding compound on the sidewalls of the package. Similarly, FIG. 5B shows the ends of tie bars 103 of structure 18, 104 of structure 19 and 94 of structure 15 exposed through the molding compound 86.

As shown in the bottom view of FIG. 6A, the tie bars 90 to 93 of structure 15, tie bar 97 to 99 of structure 16, and tie bar 95 of structure 17 can also function as leads for the semiconductor package 10. More specifically, if the semiconductor die 20 is a power MOSFET, the tie bars 90 to 93 of structure 15 can function as drain leads, the tie bars 97 to 99 of structure 16 can function as source leads being connected to a source electrode 20a through structure 18, and the tie bar 95 of structure 17 can function as a gate lead being connected to a gate electrode 20b through structure 19. The ends of tie bars that do not function as leads are exposed through molding compound on the sidewalls of the package, as seen in FIGS. 5A-5B. For example, the ends of tie bars 96, 105, and 106 (which are not leads) are exposed through molding compound 86 on the sidewalls of package 10 some distance from the bottom of the package.

This package as shown is a dual flat non-lead (DFN) sawn package, but one skilled in the art can tell that this invention can be applied to other package types. The top surface of structure 18 is exposed through the top of the molding compound 86, as shown in the top view of FIG. 6B—this improves the heat conduction of the device, and a heat sink can optionally be attached to the exposed top surface. In this embodiment the structure 19 is recessed with respect to the top of structure 18, and so is not exposed through the top of molding compound 68. Of course, the top of lead frame 14 can also be non-exposed as will be shown later in alternative embodiments.

Figure 7:
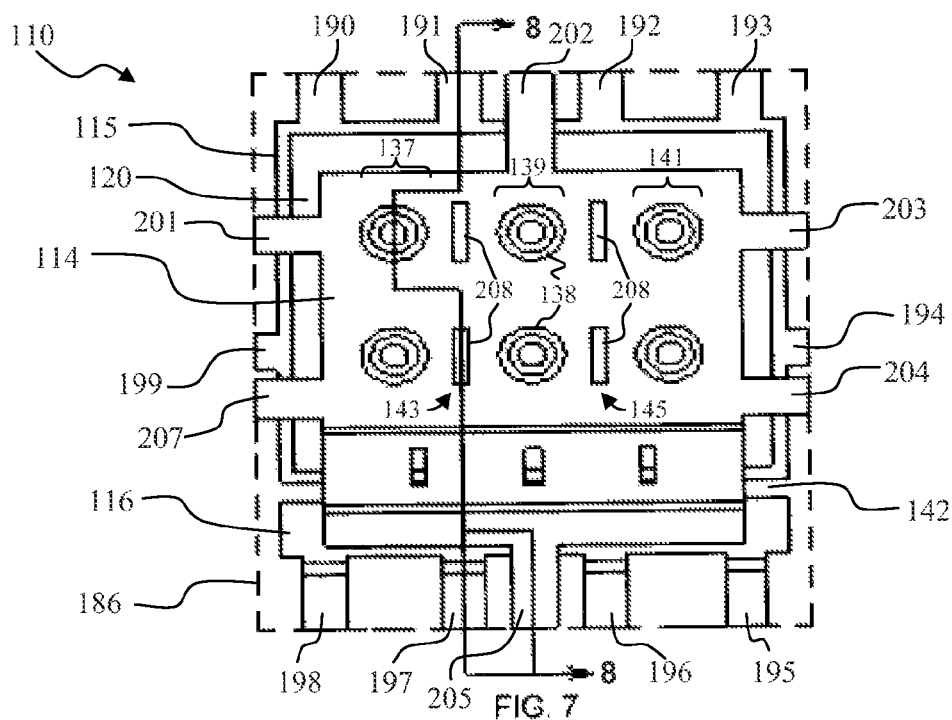
FIG. 7 is a top view of a semiconductor die package in accordance with a second embodiment of the present invention.
Figure 8:
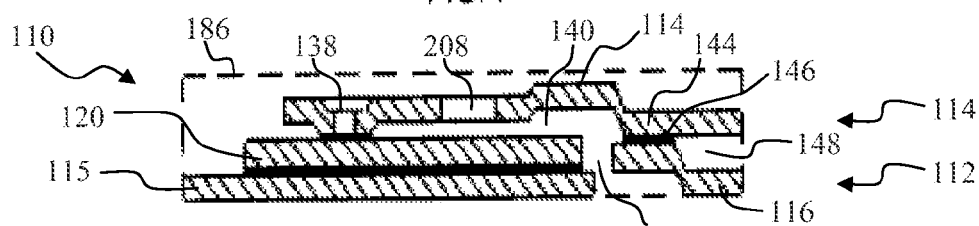
FIG. 8 is a cross-sectional view of the package shown in FIG. 7 taken along lines 8-8.

Referring to FIGS. 7 and 8, in accordance with another embodiment, package 110 includes lead frames 112 and 114, which may be fabricated from the same materials discussed above with respect to lead frames 12 and 14. Lead frame 112 is bifurcated and consists essentially of spaced-apart structures 115 and 116. Structure 115 is substantially identical to structure 15, discussed above. Semiconductor die 120 is attached to structure 115 in a manner in which semiconductor die 20 is attached to structure 15, discussed above. Structure 116 is adjacent to and spaced-apart from structure 115 and is coextensive with a side of structure 115 that is proximate thereto. As a result, structure 116 includes four spaced-apart tie bars 195-198 that extend from structure 116, away from structure 115. The tie bars 195-198 also function as leads for the package 110—they can function as leads for the top electrode (not shown) of semiconductor die 120. Structure 115 includes six tie bars 190-194 and 199. Tie bars 190-193 extend away from structure 115 in a direction opposite to the direction in which tie bars 195-198 extend and can also function as leads for the package 110—more specifically, they can function as leads for a bottom electrode (not shown) on semiconductor die 120. Tie bars 194 and 199 extend in opposite directions away from structure 115 and perpendicular to tie bars 190-193 and tie bars 195-198.

Lead frame 114 is a unitary structure that includes a plurality of tie bars, 201-205 and 207 and a plurality of contact dimples 138 arranged in three spaced-apart pairs 137, 139 and 141. As a result, package 110 is for a two terminal semiconductor die 120, with lead frame 114 being one lead contact and structure 115 being the remaining lead contact. Tie bars 202 and 205 extend in opposing directions away from semiconductor die 120. Tie bars 201 and 207 extend parallel to one another and away from tie bars 203 and 204. Tie bars 203 and 204 extend parallel to one another. Tie bars 202 and 205 extend in a direction perpendicular to tie bars 201, 203, 204 and 207. Contact dimples 138 are configured as discussed above with respect to contact dimples 38. A pair 143 of throughways 208 is disposed between contact dimple pairs 137 and 139, and a pair 145 of throughways 208 is disposed between contact dimple pairs 139 and 141. Throughways 208 are configured as discussed above with respect to throughways 108. Specifically, all portions of lead frame 114 are spaced-apart from semiconductor die 120, excepting contact dimples 138. In this manner a volume 140 is defined between lead frame 114 and semiconductor die 120. Structure 116 is in juxtaposition with, and spaced-apart from, semiconductor die 120 defining a hiatus 142 therebetween, which is in fluid communication with volume 140. A portion 144 of lead frame 114 is fixedly attached to structure 116 using a suitable electrically conductive adhesive/bonding agent 146, mentioned above. A segment of both lead frame 114 and structure 116 extend away from bonding agent 146 and spaced-apart from one another defining a gap 148 therebetween. Package 110 is encapsulated in a molding compound 186, the outline of which is shown by dotted lines, which may be formed from the same type of material as molding compound 86. As can be seen from the cross section of FIG. 8, the top of the leadframe 114 is not exposed through the molding compound 186, though in another embodiment it can be top-exposed.

Figure 1D:
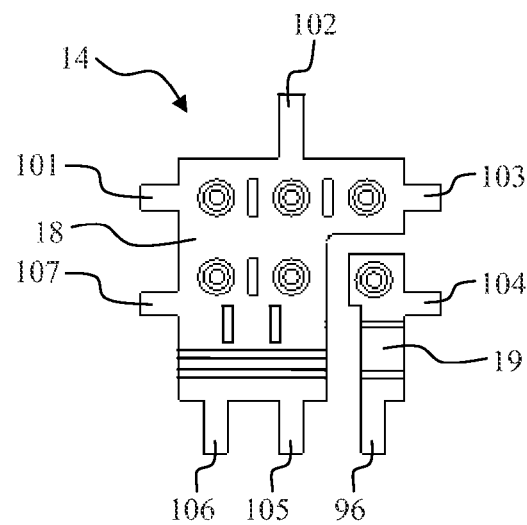
FIG. 1D is a top view of the second lead frame of the semiconductor die package of FIG. 1.
Figure 9:
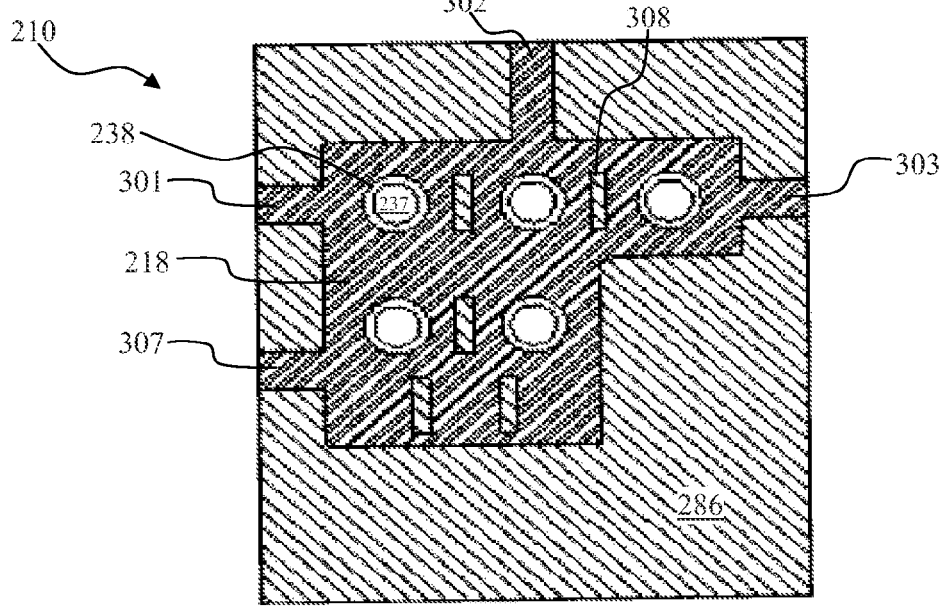
FIG. 9 is a top view of the package like that shown in FIG. 1 with molding material.
Figure 12:
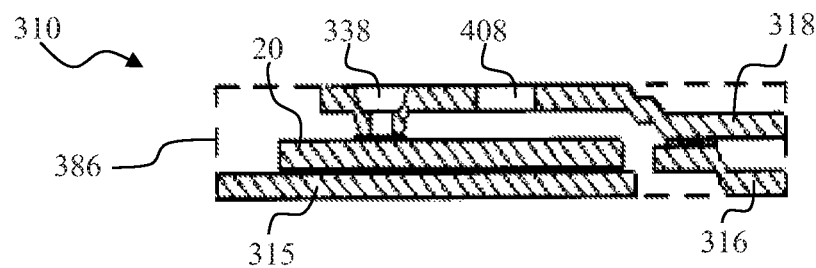
FIG. 12 is a cross-sectional view of the package shown in FIG. 11 taken along lines 12-12.
Figure 13:
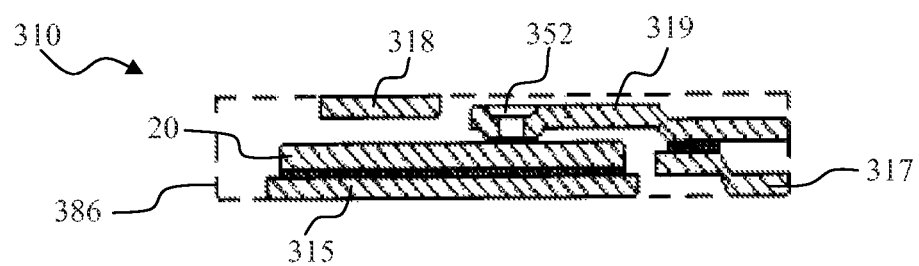
FIG. 13 is a cross-sectional view of the package shown in FIG. 11 taken along lines 13-13.
Figure 14:
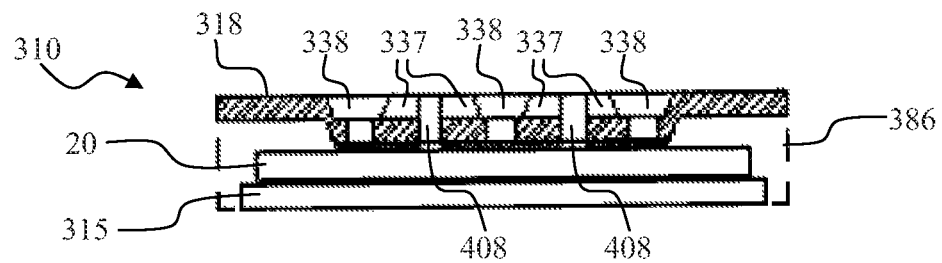
FIG. 14 is a cross-sectional view of the package shown in FIG. 11 taken along lines 14-14.
Figure 15:
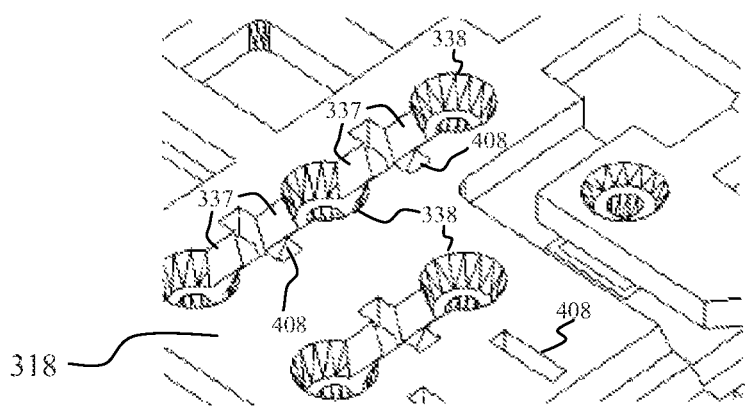
FIG. 15 is a detailed view of the contact dimples and throughways shown in FIGS. 11-14.

Referring to both FIGS. 1 and 9, package 210 is substantially the same as package 10, excepting contact dimples 238 (e.g. source dimple) extend further from semiconductor die 20, than contact dimple 52 (e.g. gate dimple); the dimples 238 also do not have vias. As a result, the top of structure 218 is exposed through molding compound 286, along with tie bars 301, 302, 307 and 303. As a result, the structure (not shown) of package 210 corresponding to structure 19 is encapsulated by molding compound 286 without its top exposed in a manner discussed above with respect to structure 19. As shown, contact dimples 238 include a nadir surface 237 opposite the semiconductor die 20. Nadir surface 237 is exposed after application of molding compound 286, i.e., molding compound 286 does not fill contact dimples 238. It should be understood, however, that some or all of contact dimples 238 may include an opening (not shown) through which molding compound 286 may propagate and fill contact dimples 238. This is discussed more fully below with respect to FIGS. 11-15. Throughways 308, however, are filled with molding compound 286. This facilitates interlocking structure 218 with molding compound 286. It should be understood that the structure (e.g. gate contact structure not shown) of package 210 corresponding to structure 19 may be exposed in a manner similar to structure 218 after molding compound 286 is applied to form package 210 if so desired in which case the gate contact structure would be formed at the same height as structure 218. Structure 215 and tie bars 290-293, 294, 295, 297-299 and 300 are exposed after application of molding compound 286 on the bottom side of package 210, shown in the bottom view of FIG. 10. The tie bars 293, 292, 291, 290, 295, 297, 298 and 299 may also function as leads for the semiconductor package 210.

Referring to FIGS. 2, 9 and 11, in another embodiment package 310 is the same as package 210, excepting that contact dimples 338 include channel 337 in fluid communication with throughways 408. As a result, semiconductor die 20 is attached to structure 315, as discussed above with respect to structure 15 and structures 318 and 319 are coupled to semiconductor die 20 and structures 316 and 317 in the same manner as structures 18 and 19 are coupled to semiconductor die 20 and structures 16 and 17.

Figure 16:
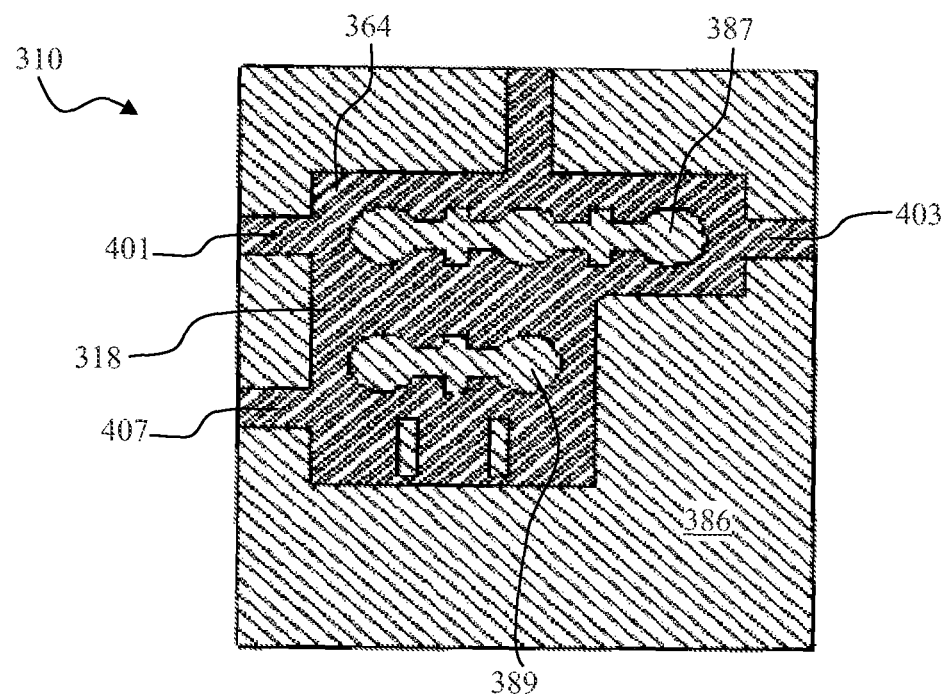
FIG. 16 is a top view of the package shown in FIG. 11 with molding material.
Figure 17:
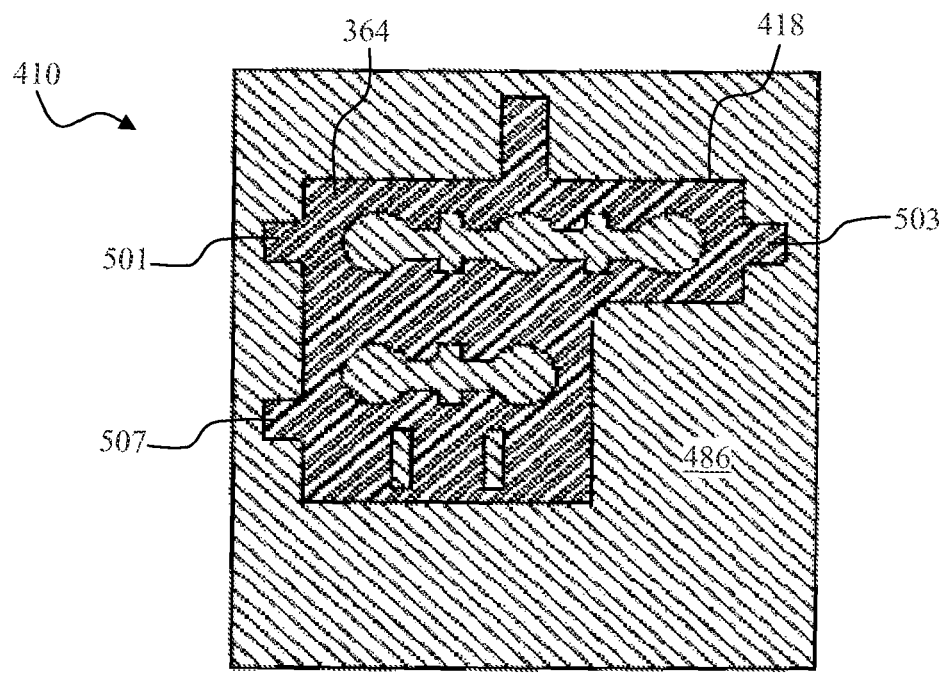
FIG. 17 is a top view of the package shown in FIG. 11 with molding material in accordance with an alternate embodiment.
Figure 18:
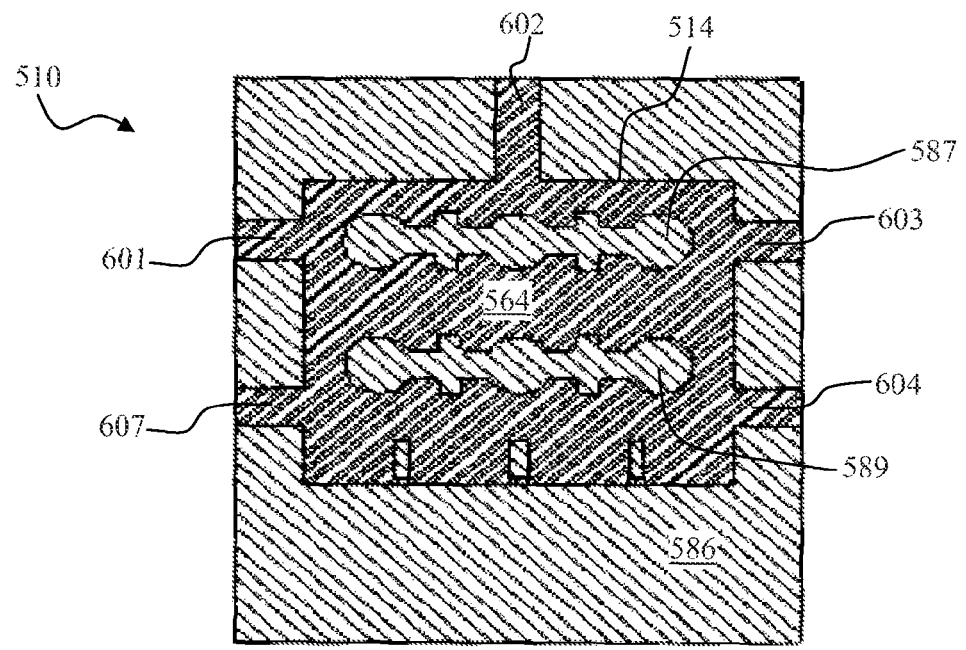
FIG. 18 is a top view of the package shown in FIG. 7 with molding material in accordance with an alternate embodiment.
Figure 19:
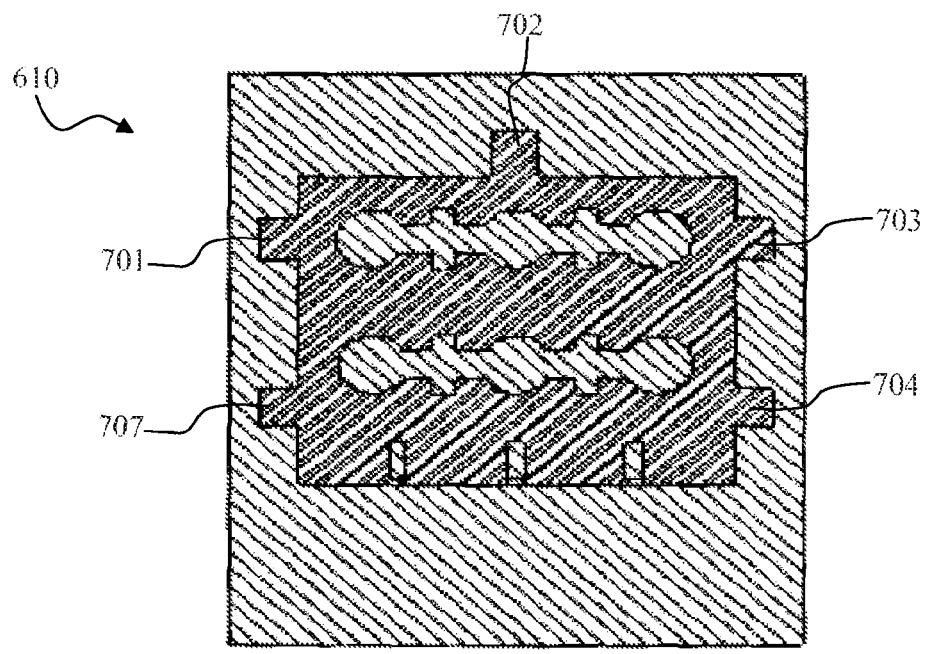
FIG. 19 is a top view of the package shown in FIG. 7 with molding material in accordance with another alternate embodiment.

Referring to FIGS. 11 to 15, the presence of channels 337 facilitate filling of contact dimples 338 with molding compound 386. Specifically, throughways 408 on structure 318 located between adjacent contact dimples 338 have a channel 337 extending to throughway 408. Channels 337 connect each contact dimple 338 disposed on opposite sides of throughway 408 in fluid communication with throughway 408. In this manner, upon molding compound 386 ingressing into throughway 408, the same propagates along channels 337 and into contact dimples 338, in fluid communication therewith. This is shown in top view of FIG. 16 by regions 387 and 389. It should be understood that a more robust interlocking function may be afforded to structure 318 by having the ends of tie bars 401, 403 and 407 configured to extend away from crown surface 364, downwards toward semiconductor die 20, as shown by tie bars 501, 503 and 507 of structure 418 of package 410 in FIG. 17. Specifically, a portion of tie bars 501, 503 and 507 of package 410 are not exposed through the top of molding compound 486 which provide a greater surface area for locking with molding compound 486.

Referring to FIGS. 7, 15, 18 and 19, similarly channels 337 may be employed with lead frame 114 so as to allow contact dimples 138 to be filled with molding compound 586. This is shown with respect to lead frame 514 having regions 587 and 589 filled with molding compound 586. The crown surfaces 564 of lead frame 514 surrounding regions 587 and 589 are exposed through molding compound 586. A more robust interlocking function may be afforded to lead frame 514 by having tie bars 601, 602, 603, 604 and 607 configured to extend away from crown surface 564, shown by tie bars 701, 702-704 and 707 of package 610.

Figure 20:
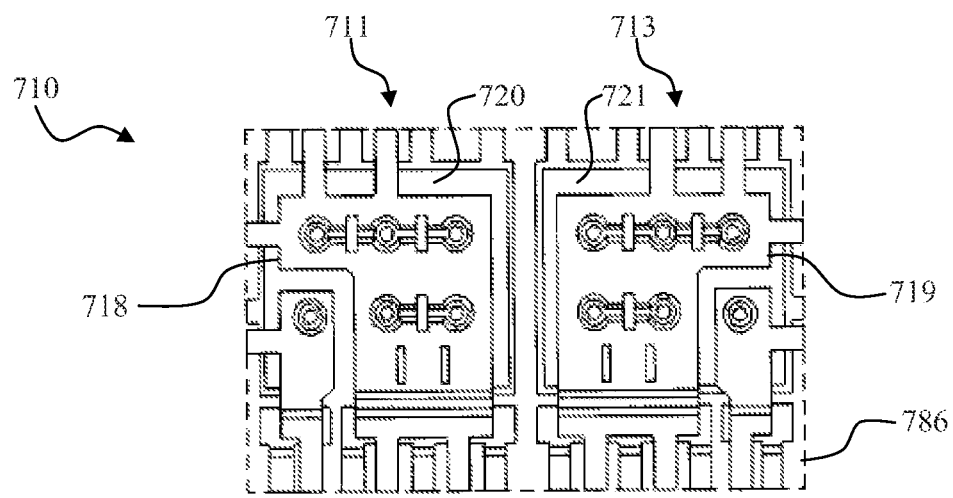
FIG. 20 is a top view of a semiconductor die package in accordance with a fourth embodiment of the present invention.
Figure 21:
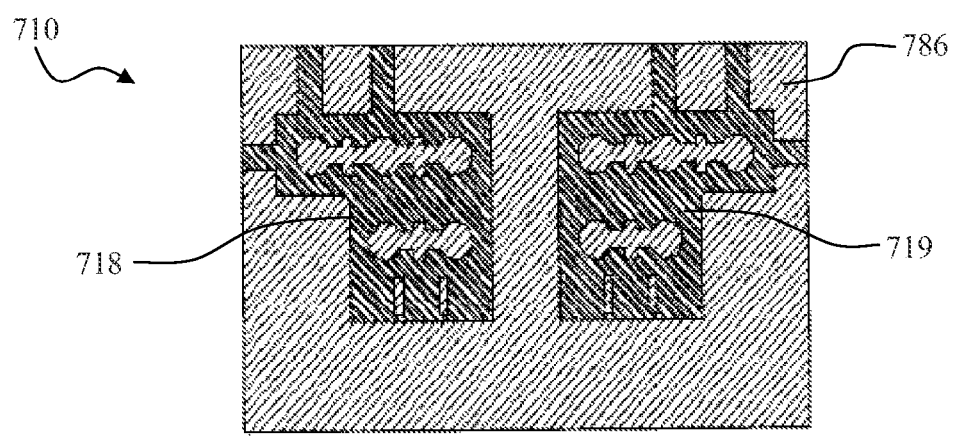
FIG. 21 top view of the package shown in FIG. 20 with molding material.
Figure 22:
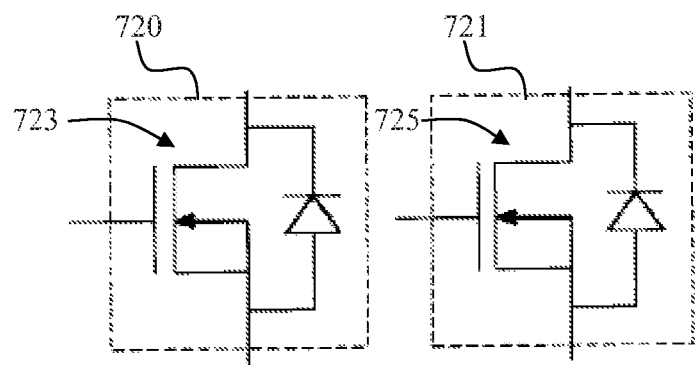
FIG. 22 is a schematic showing electronic circuitry associated with semiconductor dies shown in FIG. 20.
Figure 23:
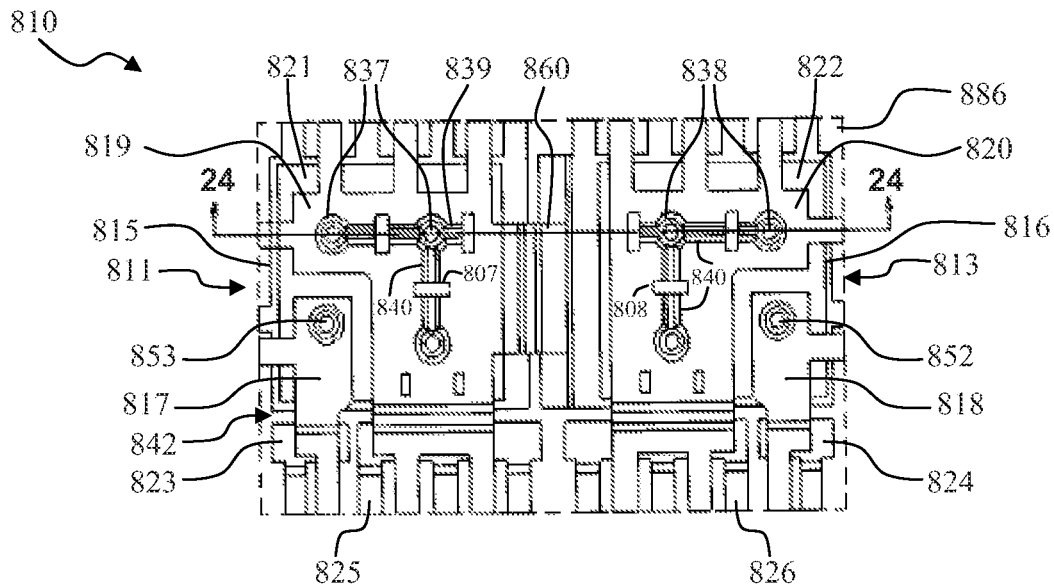
FIG. 23 is a top view of a semiconductor die package in accordance with a fifth embodiment of the present invention.
Figure 24:
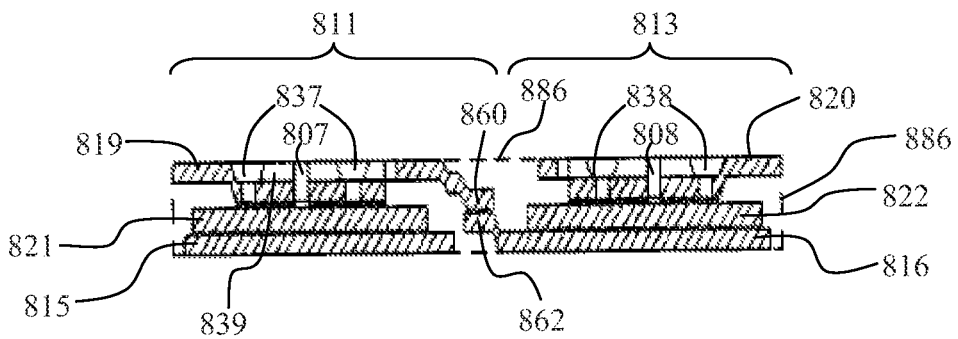
FIG. 24 is a cross-sectional view of the package shown in FIG. 23 taken along line 24-24.
Figure 25:
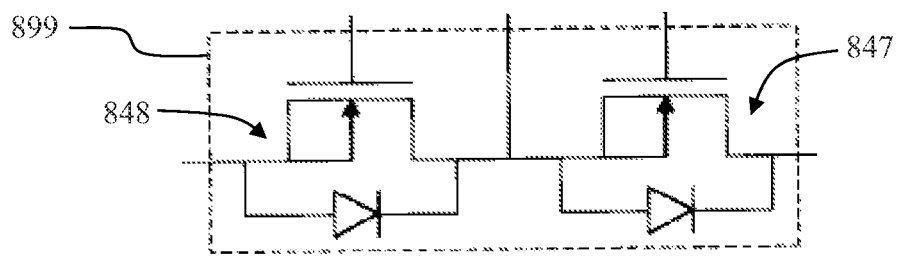
FIG. 25 is a schematic showing electronic circuitry associated with semiconductor dies shown in FIG. 23.

Referring to FIGS. 11 and 20 a dual semiconductor die package 710 is shown as two lead frame stacks 711 and 713 co-packaged in a common molding compound 786. Each of lead frame stacks 711 and 713 is nearly identical to package 310. As a result, two semiconductor dies 720 and 721 are included in package 710 and structure 718 of lead frame stack 711 and structure 719 of lead frame stack 713 are exposed through molding compound 786. Each of lead frame stacks 711 and 713 are spaced-apart and electrically isolated from one another. An example of the equivalent circuit including semiconductor dies 720 and 721 is shown as including MOSFETs, 723 and 725, respectively, in FIG. 22.

Referring to FIGS. 1, 11, 23, 24 and 25 another embodiment of a dual semiconductor die package 810 is shown in which a half bridge circuit 899 is fabricated. To that end, package 810 includes two lead frame stacks 811 and 813. Lead frame stack 811 includes electrically conductive structures 815, 817, 819, 823 and 825 and semiconductor die 821. Semiconductor die 821 includes field effect transistor 847 and is attached to structure 815 in the same manner a discussed above with respect to semiconductor die 20 being attached to structure 15. Structure 819 includes a plurality of contact dimples 837, throughways 807 and channels 839 configured similarly to contact dimples 338, channels 337 and throughways 408. Specifically, a throughway 807 is disposed between adjacent contact dimples 837 and channel 839 extends between a contact dimples 837 and throughway 807 disposed proximate thereto. Structure 819 is attached to semiconductor die 821 in the same manner as discussed above with respect to structure 18 being attached to semiconductor die 20. Excepting contact dimples 837, structure 819 is spaced-apart from semiconductor die 821, as discussed above with respect to package 10. In this manner a volume (not shown) is defined between structure 819 and semiconductor die 821 in the same manner that volume 40 is formed in package 10, as discussed above. Structure 823 is in juxtaposition with, and spaced-apart from, semiconductor die 821 defining a hiatus 842 therebetween, which is in fluid communication with the volume (not shown). Structure 825 is in juxtaposition with both semiconductor die 821 and structure 823 and spaced-apart therefrom. Structure 817 includes a contact dimple 853. Structure 817 is coupled to semiconductor die 821 and structure 823 in the same manner as structure 19 is connected to semiconductor die 20 and structure 17, as discussed above.

Lead frame stack 813 includes electrically conductive structures 816, 818, 820, 824 and 826, as well as semiconductor die 822. Semiconductor die 822 includes field effect transistor 848. Conductive structures 818, 820, 824 and 826 and semiconductor die 822 are coupled together as discussed above with respect to the coupling together of structures 817, 819, 823 and 825 and semiconductor die 821 of lead frame stack 811. To that end, structure 820 includes a plurality of contact dimples 838, throughways 808 and channels 840 configured similarly to contact dimples 837, throughways 807, and channels 840. Excepting contact dimples 838, structure 820 is spaced-apart from semiconductor die 822, as discussed above with respect to lead frame stack 811. In this manner a volume (not shown) is defined between structure 820 and semiconductor die 822 in the same manner that volume 40 is formed in package 10, as discussed above. Structure 819, however differs from structure 820 by inclusion of an electrical contact member 860 extending from the former. A complementary electrical contact member 862 extends from structure 816 toward contact member 860, which are coupled together using any suitable conductive adhesive/bonding agent discussed above. In this manner, a drain regions of field effect transistor 848 of semiconductor die 822 is placed in electrical contact with a source region of field effect transistor 847 of semiconductor die 821 to form the half bridge circuit 899. First and second lead frame stacks 811 and 813 are encapsulated in molding compound 886 to form package 810. The half bridge circuit is useful in many applications such as power conversion, particularly in DC-DC buck converters.

Referring to FIGS. 11, 25, and 26 through 29 in another embodiment the half bridge circuit 899 may be fabricated using package 910. Package 910 includes semiconductor dies 900 and 902 placed in superimposition. To that end, package 910 includes three lead frames 903, 904 and 905 formed from electrically conductive material, as discussed above. Each pair of adjacent lead frames 903, 904 and 905 has one of semiconductor dies 900 and 902 disposed therebetween. Lead frame 903 includes six structures 906, 907, 908, 909, 910, and 911. Lead frame 904 includes two structures 912 and 913 that are identical to structures 318 and 319. Structures 907, 910 and 911 are nearly identical to structures 314, 317 and 316, respectively. Semiconductor die 900 is connected to structure 907 in the same manner as semiconductor die 20 is connected to structure 314. Similarly, structures 912 and 913 are connected to semiconductor die 900 in the same manner as structures 318 and 319 are connected to semiconductor die 20. A drain region of field effect transistor 848 of semiconductor die 902 is connected to a source region of field effect transistor 847 of semiconductor die 900 using structure 912. To that end, one side of semiconductor die 902 is conductively attached to structure 912, e.g., by a layer 914 of conductive adhesive/bonding agent. Note that semiconductor die 902 is isolated from structure 913 which is recessed with respect to structure 912. In this way a larger die size may be used for semiconductor die 902 because it can overlap structure 912 without making contact to it.

Referring to FIGS. 25-29 lead frame 905 includes two structures 920 and 921. Structure 920 includes two pairs of spaced apart contact dimples 922 with a throughway 923 disposed therebetween. A channel 924 extends between each pair of adjacent contact dimples 922 placing the same in fluid communication with the throughway 923 disposed between adjacent contact dimples 922 of the pair. Contact dimples 922, throughway 923 and channel 924 are arranged as discussed above with respect to contact dimples 338, throughway 408 and channel 337 shown in FIG. 15. Excepting contact dimples 922, structure 920 is spaced-apart from semiconductor die 902. In this manner a volume 940 is defined between structure 920 and semiconductor die 902. Void 940 is contiguous with a hiatus 943 defined between structure 920 and both structures 912 and 907. Structure 920 is in electrical communication with structure 906 employing a layer 944 of conductive adhesive/bonding agent, and structure 921 is in electrical communication with structure 908 employing a layer 945 of conductive adhesive/bonding agent. Similarly, a layer 946 of conductive adhesive/bonding agent fixedly attaches contact dimples 922 to semiconductor die 902, and a layer 947 of conductive adhesive/bonding agent fixedly attaches contact dimple 925 of structure 921 to semiconductor die 902. A molding compound 986, shown by dotted lines, encapsulates semiconductor die 900, 902, lead frames 903, 904 and 905, excepting ends of tie bars 950-976, the top of structure 920 and the bottoms of tie bars of lead frame 903.

The tie bars of lead frame 903 are exposed through the bottom of the molding compound 986 and also serve as leads for the package 910. More specifically, in accordance with the half bridge circuit of FIG. 25, tie bars 950, 951, 952, and 954 of structure 906 can function as source leads for semiconductor die 902 through the connection of structure 920 and structure 906. Similarly, tie bars 955, 957, 959, 961 of structure 907 can function as drain leads for semiconductor die 900. Tie bar 962 of structure 908 can function as a gate lead for semiconductor die 902 through the connection of structure 921 and structure 908. Tie bar 968 of structure 910 can function as a gate lead for semiconductor die 900 through the connection of structure 913 and structure 910. Tie bars 970, 975, 974 of structure 911 can function as source leads for semiconductor die 900, as well as drain leads for semiconductor die 902 through the connection of structure 912 and structure 911. The ends of tie bars that do not function as leads are individually exposed through the molding compound on the sidewalls of the package some distance from the bottom of the package. In a half bridge configuration such as FIGS. 25 and 26 for power applications, semiconductor die 900 is known as the high side FET, and semiconductor die 902 is known as the low side FET. As shown in the top view of FIG. 26, the tie bars 950-976 extend in perpendicular directions which allow for better stability and proper alignment during assembly, especially during a batch assembly process.

Referring to FIGS. 1 and 30-32, one example of fabricating a package similar to package 10 is achieved employing a batch processing technique. In this manner a lead frame similar to lead frame 12 is formed as an array 1070 of lead frames, shown as 1071-1074. Only four are shown for ease of discussion. For example, array 1070 can comprise of 16 lead frames arranged in four rows and four columns. Array 1070 includes a frame 1075 that surrounds array 1070. As shown semiconductor dies, 1076-1079 are attached to lead frames 1071-1074, respectively, as discussed above. Lead frames similar to lead frame 14 are similarly arranged in an array 980, shown as lead frames 981-984. Arrays 1070 and 980 are configured so that each of lead frames 1071-1074 is associated with one of lead frames 981-984. As a result, there may be 16 lead frames associated with array 980, though only four are shown for ease of discussion. A frame 985 surrounds array 980 and aligns with frame 1075 when arrays 1070 and 980 are configured properly. Specifically, arrays 1070 and 980 are configured to be placed in superimposition and align each of lead frames 1071-1074 with one of lead frames 981-984 and the corresponding semiconductor die 1076-1079, forming an array stack 1086. To that end, frame 1075 includes a plurality of alignment orifices 987 and frame 985 includes a plurality of alignment protrusions 988. Protrusions 988 and orifices 987 are configured to establish proper alignment between arrays 1070 and 980 upon protrusions 988 being received with one of orifices 987. In this manner multiple packages may be fabricated concurrently and efficiently. The multiple tie bars in perpendicular directions from lead frames 1071-1074 and 981-984 keep the lead frames aligned during the batch process. After this, molding compound may be applied, and the arrays of lead frames may be singulated into individual packages. The simultaneous fabrication using arrays of lead frames for the top and bottom of the packages results in the ends of tie bars of both lead frames being exposed through the molding compound, as shown in FIGS. 5A-5B. The ends of tie bars that do not function as leads are exposed through the molding compound on the sidewalls of the package away from the bottom of the package.

Figure 35:
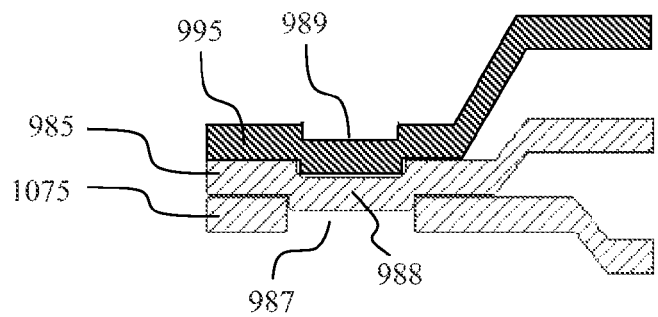
FIG. 35 is a side cross sectional view of alignment orifices and alignment protrusions for a lead frame structure like that shown in FIGS. 26-34.

Similarly, to form a lead frame structure similar to that of package 910 of FIGS. 26-29, the process can be continued from a structure similar to that shown in FIG. 31 with FIGS. 33-35. Second semiconductor dies 996-999 may be attached to the tops of lead frames 981-984 similarly to that shown in FIG. 26E. Next an array 990 of top lead frames 991-994 having a frame 995 may be attached to the second semiconductor dies 996-999 forming a structure similar to package 910 of FIG. 26. To that end, additional protrusions 989 of frame 995 of the array 990 may fit into the top of protrusions 988 of frame 985 of array 980 as shown in FIG. 35. Next a molding compound may be formed around the lead frame stacks and the packages may be singulated, e.g. by sawing or punching. The simultaneous fabrication using arrays of lead frames results in the ends of tie bars of each lead frame being exposed through the molding compound.

Figure 26:
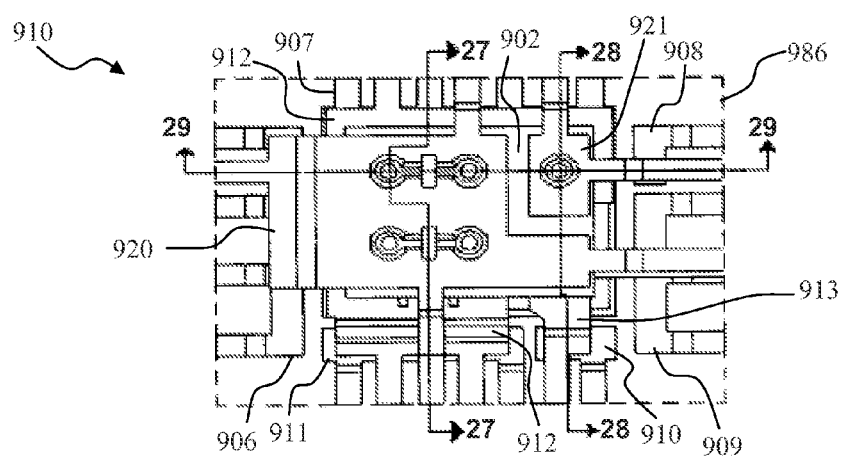
FIG. 26 is a top view of a semiconductor die package in accordance with another embodiment of the present invention.
Figure 26A:
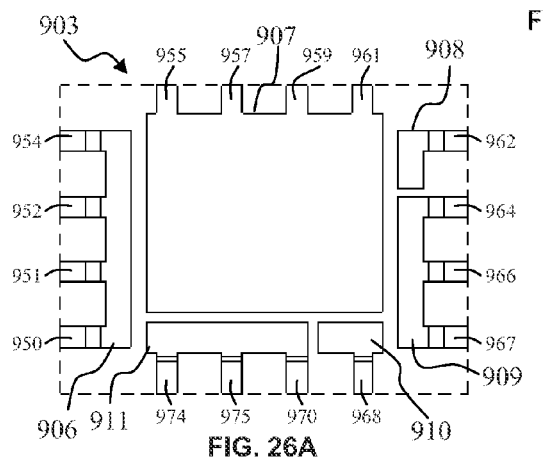
FIG. 26A is a top view of the bottom lead frame of the package of FIG. 26.
Figure 26B:
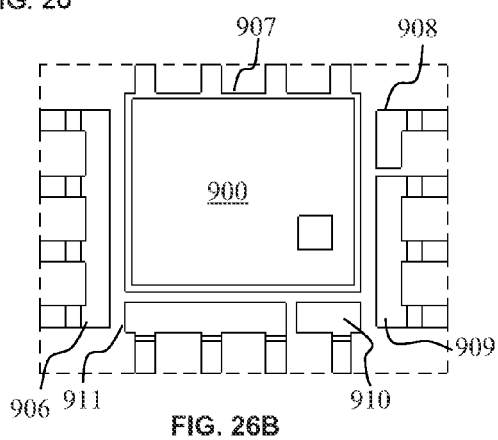
FIG. 26B is a top view a first semiconductor die mounted on the bottom lead frame of the package of FIG. 26.
Figure 26C:
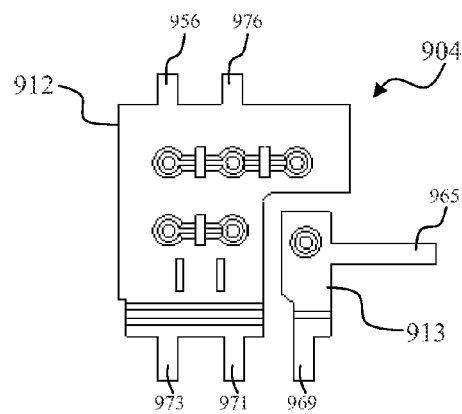
FIG. 26C is a top view of a middle lead frame of the package of FIG. 26.
Figure 26D:
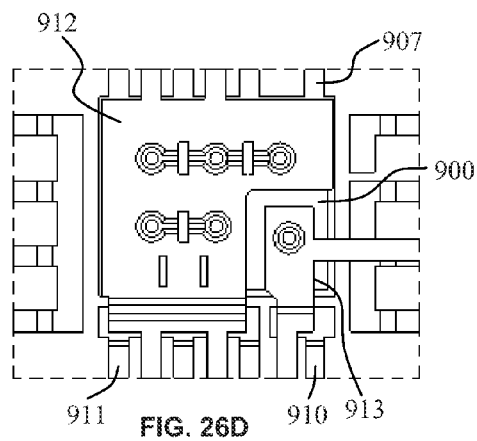
FIG. 26D is a top view of the middle lead frame mounted on the first semiconductor die and bottom lead frame of the package of FIG. 26.
Figure 26E:
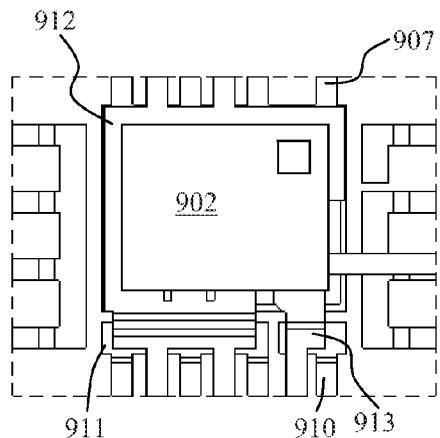
FIG. 26E is a top view of the second semiconductor die mounted on the middle lead frame of the package of FIG. 26.
Figure 26F:
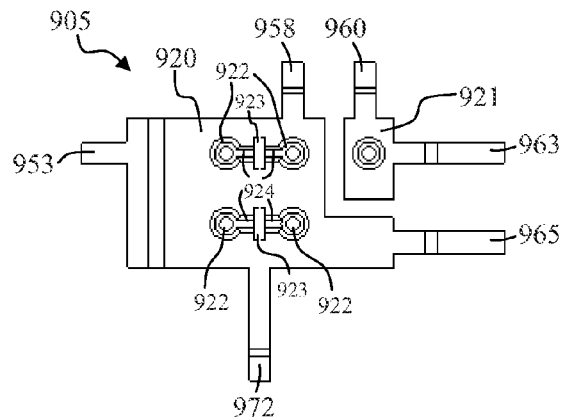
FIG. 26F is a top view of the top lead frame of the package of FIG. 26.
Figure 27:
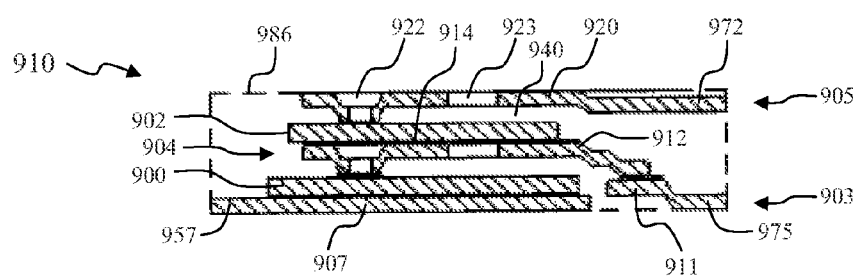
FIG. 27 is a cross-sectional view of the package shown in FIG. 26 taken along lines 27-27.
Figure 28:
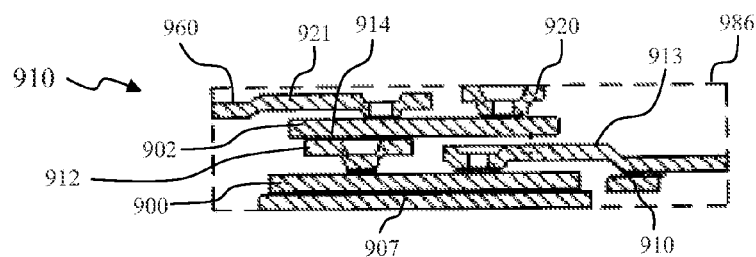
FIG. 28 is a cross-sectional view of the package shown in FIG. 26 taken along lines 28-28.
Figure 29:
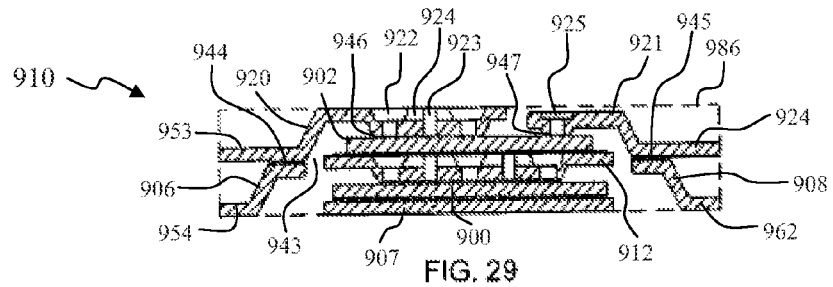
FIG. 29 is a cross-sectional view of the package shown in FIG. 26 taken along lines 29-29.
Figure 30:
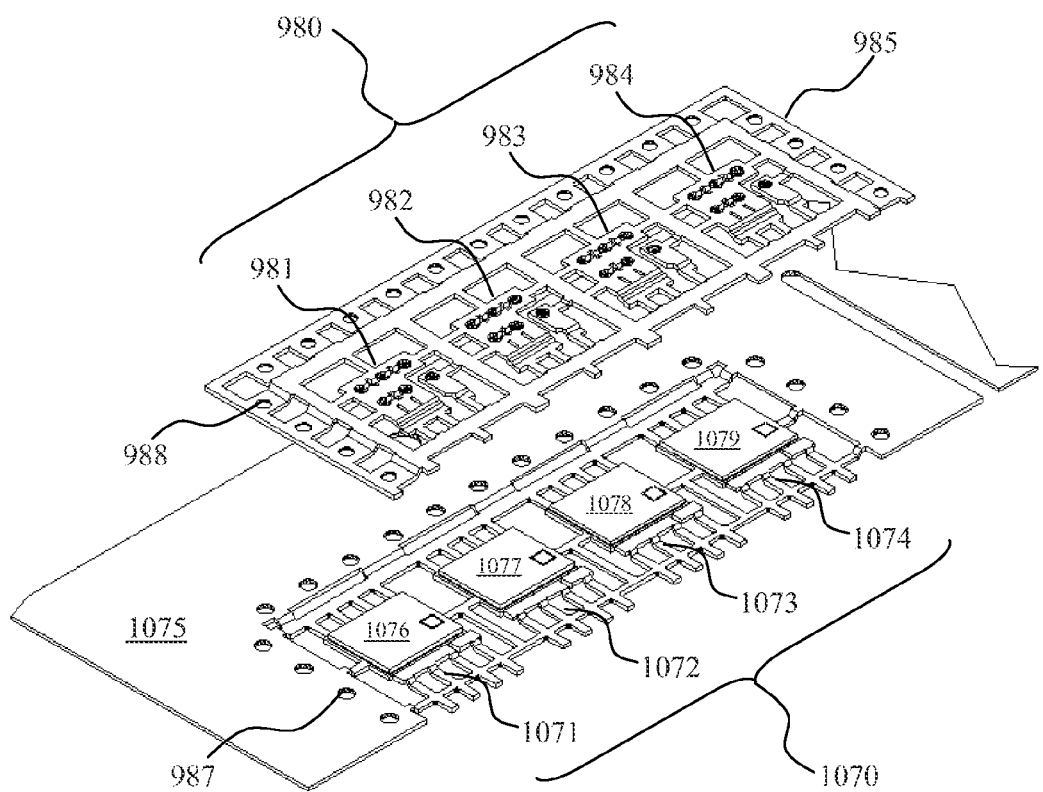
FIG. 30 is a perspective view showing a batch processing technique for assembling the package of FIG. 1.
Figure 36:
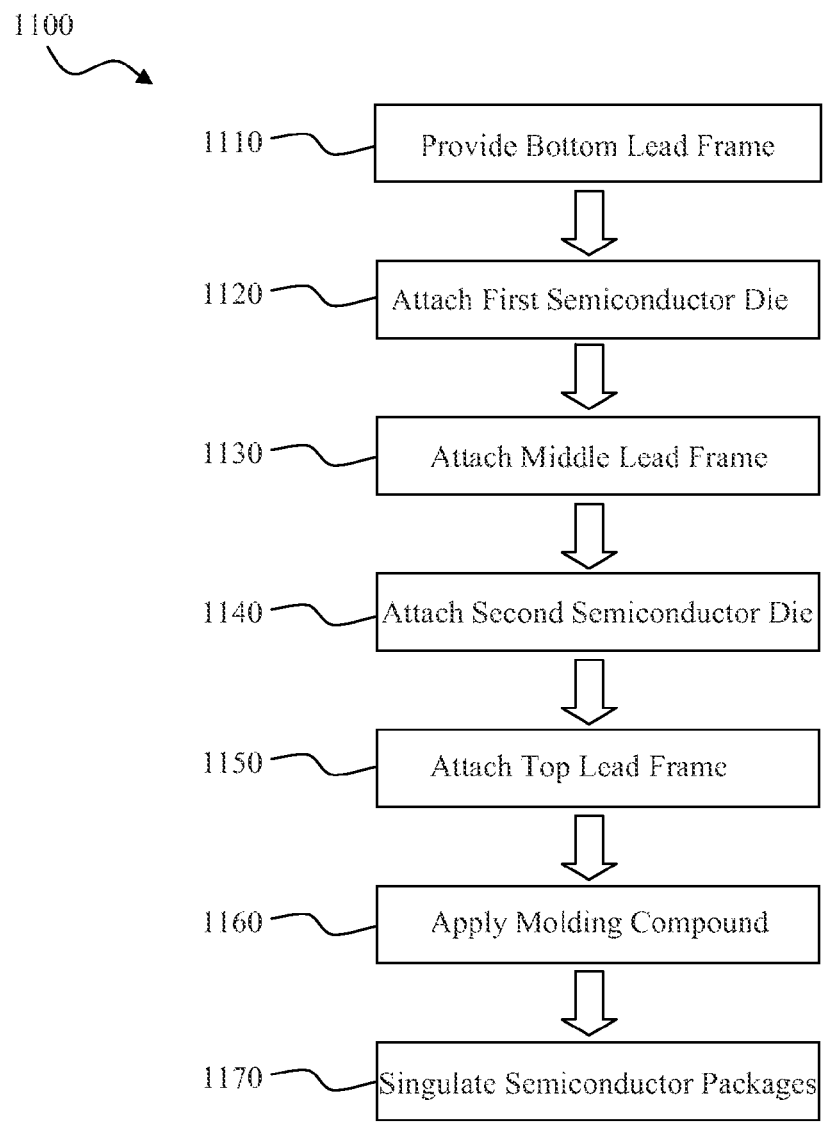
FIG. 36 is a process flow diagram illustrating the steps involved in forming a package such as that shown in FIG. 26.

The process flow for forming a stacked lead frame structure such as package 910 of FIG. 26 is outlined in FIG. 36. The process 1100 begins with step 1110 of providing a bottom lead frame (which can be an array of bottom lead frames connected together on a frame), followed by step 1120 of die attaching a first semiconductor die to the bottom lead frame. A middle lead frame (which can be an array of middle lead frames connected together on a frame) is then attached to the top of the first semiconductor die, so that the first semiconductor die is between the first and second lead frames in step 1130. In step 1140, a second semiconductor die is die attached to the top of the middle lead frame, and in step 1150 the top lead frame (which can be an array of top lead frames connected together on a frame) is attached to the top of the second semiconductor die. A molding compound is applied in step 1160, and then the semiconductor packages may be singulated into individual packages in step 1170, e.g., by sawing or punching to form a package like 910 of FIG. 26.

It should be understood that the foregoing description is merely an example of the invention and that modifications and may be made thereto without departing from the spirit and scope of the invention and should not be construed as limiting the scope of the invention. The scope of the invention, therefore, should be determined with respect to the appended claims, including the full scope of equivalents thereof.

The invention claimed is:

1. A method of fabricating a lead frame package said method comprising:
   providing a first lead frame;
   fixedly attaching a first semiconductor die to said first lead frame;
   fixedly attaching a second lead frame to said first semiconductor die, with said first semiconductor die being disposed between said first and second lead frames, said second lead frame being in superimposition with said first lead frame and being spaced apart from said first lead frame;
   fixedly attaching a second semiconductor die to said second lead frame, with said second lead frame being disposed between said first and said second semiconductor dies and electrically connecting a contact on said first semiconductor die to a contact on said second semiconductor die;
   fixedly attaching a third lead frame to said second semiconductor die, with said second semiconductor die being disposed between said second and said third lead frames, said third lead frame being in superimposition with said first lead frame and said second lead frame and in an electrical contact with said second semiconductor die;
   encapsulating said semiconductor dies in an electrically non-conductive compound; and
   singulating said package.

2. The method as recited in claim 1 wherein said providing first lead frame further comprises providing a first array of said first lead frames connected on a first frame,
   wherein said fixedly attaching a second lead frame further comprises fixedly attaching a second array of said second lead frames connected on a second frame to said first semiconductor die,
   wherein said fixedly attaching a third lead frame further comprises fixedly attaching a third array of said third lead frames connected on a third frame to said second semiconductor die, and
   wherein said singulating said package further comprises singulating said arrays of lead frames into individual packages.

3. The method as recited in claim 1 wherein the first and the second semiconductor dies are power field effect transistors (FETs) wherein and said fixedly attaching a second semiconductor die is performed such that a source of one of the semiconductor dies is electrically connected to a drain of the other semiconductor die through said second lead frame.

4. The method as recited in claim 3 wherein said second lead frame further comprises an additional conductive structure which is electrically connected to said first semiconductor die but not to said second semiconductor die, said additional conductive structure being recessed from said second semiconductor die.

5. The method as recited in claim 1 wherein each lead frame includes multiple tie bars and wherein said singulating results in the ends of said multiple tie bars being exposed through said electrically non-conductive compound.

6. The method as recited in claim 5 wherein the ends of some of the tie bars are not leads of the package and those ends are exposed through the sidewalls of the package.

7. The method as recited in claim 5 wherein ones of the second and the third lead frames further comprise tie bars extending in perpendicular directions.

8. A method of fabricating a lead frame package said method comprising:
   providing a first array of first lead frames connected on a first lead frame;
   fixedly attaching a first semiconductor die to said first lead frame;
   fixedly attaching a second array of second lead frames connected on a second lead frame to said first semiconductor die; with said first semiconductor die being disposed between said first and said second lead frames being in superimposition with said first lead frame and being spaced apart from said first lead frame;
   fixedly attaching a second semiconductor die to said second lead frame, with said second lead frame being disposed between said first and second semiconductor dies and electrically connecting a contact on said first semiconductor die to a contact on said second semiconductor die;
   fixedly attaching a third lead frame to said second semiconductor die, with said second semiconductor die being disposed between said second and said third lead frames;
   encapsulating said semiconductor dies in an electrically non-conductive compound; and
   singulating said package.

9. The method as recited in claim 8 wherein said fixedly attaching a third lead frame further comprises fixedly attaching a third array of said third lead frames connected on a third frame to said second semiconductor die.

10. The method as recited in claim 8 wherein the first and second semiconductor dies are power field effect transistors (FETs) wherein and said fixedly attaching a second semiconductor die is performed such that a source of one of the semiconductor dies is electrically connected to a drain of the other semiconductor die through said second lead frame.

11. The method as recited in claim 10 wherein said second lead frame further comprises an additional conductive structure which is electrically connected to said first semiconductor die, said additional conductive structure being recessed from said second semiconductor die.

12. The method as recited in claim 8 wherein each of said first and second lead frames includes multiple tie bars and wherein said singulating results in the ends of said multiple tie bars being exposed through said electrically non-conductive compound.

13. The method as recited in claim 12 further including providing said package with sidewalls, with ends of a sub-portion the tie bars being exposed through said sidewalls.

14. The method as recited in claim 1 wherein one of the second and the third lead frames further comprise tie bars extending in perpendicular directions.

15. A method of fabricating a lead frame package said method comprising:
   providing a first array of first lead frames connected on a first lead frame,
   fixedly attaching a first semiconductor die to said first lead frame;
   fixedly attaching a second array of lead frames connected on a second lead frame to said first semiconductor die, with said first semiconductor die being disposed between said first and said second lead frames, said second lead frame being in superimposition with said first lead frame and being spaced apart from said first lead frame;
   fixedly attaching a second semiconductor die to said second lead frame, with said second lead frame being disposed between said first and second semiconductor dies and electrically connecting a contact on said first semiconductor die to a contact on said second semiconductor die;
   fixedly attaching a third array of a third lead frame to said second semiconductor die, with said second semiconductor die being disposed between said second and said third lead frames, said third lead frame being in superimposition with said first lead frame and said second lead frames and in an electrical contact with said second semiconductor die;
   encapsulating said semiconductor dies in an electrically non-conductive compound; and
   singulating said package.

16. The method as recited in claim 15 wherein said second lead frame further comprises an additional conductive structure which is electrically connected to said first semiconductor die, said additional conductive structure being recessed from said second semiconductor die.

17. The method as recited in claim 16 wherein each of said first and second lead frames includes multiple tie bars and wherein said singulating results in the ends of said multiple tie bars being exposed through said electrically non-conductive compound.

18. The method as recited in claim 17 further including providing said package with sidewalls, with ends of a subportion the tie bars being exposed through said sidewalls.

19. The method as recited in claim 18 wherein the third lead frame further comprise tie bars extending in perpendicular directions.

20. The method as recited in claim 19 wherein the first and second semiconductor dies are power field effect transistors (FETs) wherein and said fixedly attaching a second semiconductor die is performed such that a source of one of the semiconductor dies is electrically connected to a drain of the other semiconductor die through said second lead frame.

* * * * *